United States Patent [19]
Hsu et al.

[11] Patent Number: 5,854,108
[45] Date of Patent: Dec. 29, 1998

[54] METHOD AND SYSTEM FOR PROVIDING A DOUBLE DIFFUSE IMPLANT JUNCTION IN A FLASH DEVICE

[75] Inventors: James Hsu, Saratoga; Jian Chen; Yuan Tang, both of San Jose, all of Calif.

[73] Assignee: Advanced Micro Devices, Inc., Sunnyvale, Calif.

[21] Appl. No.: 658,038

[22] Filed: Jun. 4, 1996

[51] Int. Cl.$^6$ .................................................. H01L 21/336
[52] U.S. Cl. ........................ 438/257; 438/263; 438/264; 438/306
[58] Field of Search .................................. 438/257, 261, 438/263, 264, 265, 259, 301, 303, 306

[56] References Cited

U.S. PATENT DOCUMENTS

| | | | |
|---|---|---|---|
| 4,957,877 | 9/1990 | Tam et al. ................................. | 437/43 |
| 5,445,981 | 8/1995 | Lee ......................................... | 438/257 |
| 5,470,773 | 11/1995 | Liu et al. . | |
| 5,482,881 | 1/1996 | Chen et al. . | |
| 5,502,321 | 3/1996 | Matsushita ............................. | 257/316 |
| 5,534,455 | 7/1996 | Liu . | |
| 5,552,331 | 9/1996 | Hsu et al. . | |
| 5,553,018 | 9/1996 | Wang et al. . | |

*Primary Examiner*—Tuan H. Nguyen
*Attorney, Agent, or Firm*—Sawyer & Associates

[57] ABSTRACT

A system and method for providing a very short channel memory cell having a double diffuse implant junction is disclosed. The system and method comprise the sequential steps of providing a junction implant, providing a spacer, and providing a double diffuse implant. Because the double diffuse implant is provided after the spacer, the double diffuse implant does not extend as far under the gate of a memory cell after processing. Thus, the memory cell has a graded junction that does not substantially shorten the effective length of the channel. The memory cell can, therefore, function even as the size of the memory cell is decreased. In addition, the thermal cycling of the double diffuse implant may be decoupled from that of the junction implant. This is achieved without complicating processing. Consequently, overall system performance is enhanced.

27 Claims, 6 Drawing Sheets

METHOD AND SYSTEM FOR PROVIDING A DOUBLE DIFFUSE IMPLANT JUNCTION IN A FLASH DEVICE

FIELD OF THE INVENTION

The present invention relates to memory elements, and more particularly to a method and system for providing a double diffuse implant junction in a FLASH EPROM device.

BACKGROUND OF THE INVENTION

A typical memory chip includes a plurality of memory cells. A particular cell is comprised of a source junction ("junction"), a drain, and a gate. The area between the junction and the drain is the channel. Between at least a portion of the gate and the channel is a tunneling oxide.

One conventional method for making the junction of a cell uses a single implant, typically arsenic. However, this method results in an abrupt junction. Because the junction is abrupt, the electric field at the corner of the gate is extremely strong during erasure. This strong electric field causes band-to-band tunneling of electrons from the valence band to the conduction band of the silicon, leaving behind holes causing a variety of problems.

First, the holes create a large substrate current. Second, because of the lateral electric field near the junction, the holes can also move laterally. This lateral motion can cause interface damage. Finally, the holes may also travel onto the gate. Holes traveling to the gate may cause an accidental erasure of the cell.

In order to remedy the problems caused by band-to-band tunneling of electrons, typical cells implement a double diffuse implant. The double diffuse implant provides a graded junction. This reduces band-to-band tunneling. The implant is typically comprised of phosphorus. In conventional semiconductor processing, the double diffuse implant is carried out prior to the junction implant. The junction implant is typically comprised of arsenic ("As"). Because phosphorus diffuses more rapidly than As, after thermal cycling, the As junction will be shallow while the double diffuse implant will be deeper. The double diffuse implant will also extend farther under the gate, thereby shortening the channel length. In addition, the diffusion rate of the double diffuse implant will constrain the thermal cycling used in processing the junction.

Because a high density of storage elements are desired, it is necessary to make storage elements smaller. As the cell becomes smaller, the shortening of the channel length limits the ability of the device to function. Consequently, for very short channel length or a high density of devices, there are conflicting constraints. A graded junction is desired in order to reduce band-to-band tunneling. However, the effective channel length must be greater than a minimum size in order for the device to function.

For FLASH EPROM devices, one way of increasing density is through the use of a self aligned source ("SAS") etching technique. An example of this type of technique is disclosed in U.S. Pat. No. 5,120,671 entitled "PROCESS FOR SELF ALIGNING A SOURCE REGION WITH A FIELD OXIDE REGION AND A POLY-SILICON GATE." The SAS technique, however, can damage the tunneling oxide and gouge the area where the junction is formed. A description of the problems of the SAS technique and a method for addressing these problems is disclosed in U.S. Pat. No. 5,470,773 entitled "METHOD PROTECTING A STACKED GATE EDGE IN A SEMICONDUCTOR DEVICE FROM SELF ALIGNED SOURCE (SAS) ETCH." Although these patents address SAS techniques, neither discloses how these techniques could be utilized with a very short channel FLASH EPROM device.

Accordingly, what is needed is a system and method for a cell having a graded junction which does not substantially shorten the effective channel length. In addition, because each step in semiconductor processing is complex, it is desirable to produce such a device without adding a substantial number of steps to the process. Finally, in the context of FLASH EPROM devices, it would be beneficial if the SAS technique could be employed while processing very short channel FLASH cells having a double diffuse implant junction. The present invention addresses such a need.

SUMMARY OF THE INVENTION

A system and method for providing a memory cell having a double diffuse implant junction is disclosed. the system and method comprise the sequential steps of providing a junction implant, providing a spacer, and providing a double diffuse implant. Because the double diffuse implant is provided after the spacer, the double diffuse implant does not extend as far under the gate of a memory cell after processing. Thus, the memory cell has a graded junction that does not substantially shorten the effective length of the channel. The memory cell can, therefore, function even as the size of the memory cell is decreased. In addition, the thermal cycling of the double diffused implant may be decoupled from that of the junction implant. This is achieved without significantly complicating processing. Consequently, the performance of the memory cell is enhanced.

DESCRIPTION OF THE INVENTION

The present invention relates to an improvement in binary storage elements. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein. Although the embodiments are described with reference to FLASH EPROM cells and the self aligned source (SAS) technique, the present invention is not limited to these types of cells or to use only with this processing technique.

Figure 1A:
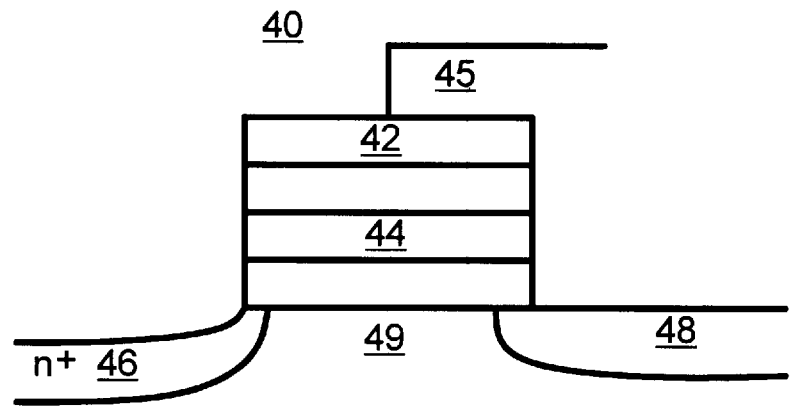
FIG. 1a is a diagram of a typical FLASH cell.

FIG. 1a is a diagram of a typical memory cell 40. Memory cell 40 is comprised of control gate 42, floating gate 44, junction 46, drain 48, and channel 49. Memory cell 40 is shown with SAS mask 45. The junction is abrupt because it has a rapid change in dopant concentration between the n+ doped junction 46 and channel 49. Thus, memory cell 40 will have problems associated with band-to-band tunneling of electrons.

Figure 1B:
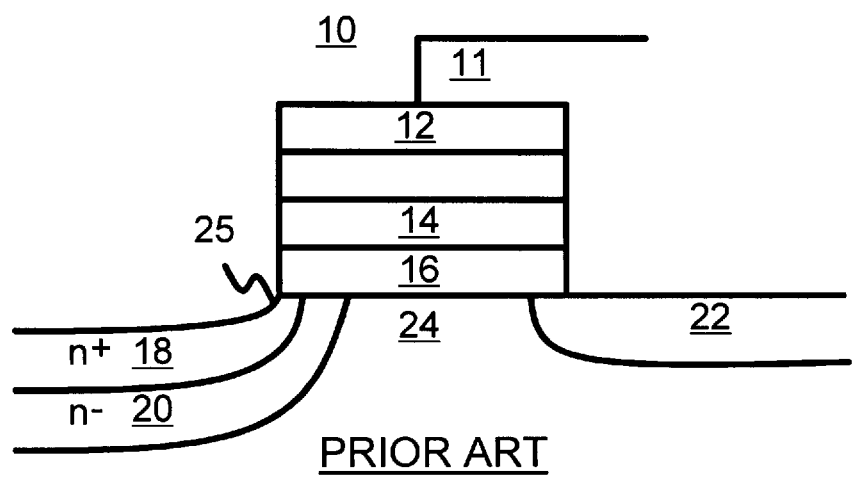
FIG. 1b is a diagram of a typical FLASH cell having a graded junction and made using the SAS technique.

FIG. 1b is a diagram of a typical FLASH cell 10 having a double diffuse implant junction and made using a conventional SAS process. FLASH cell 10 is comprised of control gate 12, floating gate 14, tunneling oxide 16, junction implant 18, double diffuse implant ("DDI") 20, drain 22, and channel 24. FLASH cell 10 is shown with SAS mask 11 in place. Since DDI 20 has been provided, the junction is graded. However, because of the SAS technique used, damage, shown generally by 25, has been incurred in tunneling oxide 16 and junction implant region 18.

Figure 1C:
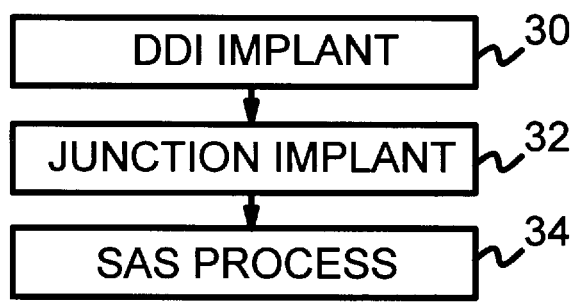
FIG. 1c is a simplified flow chart of a typical process used to produce a memory element using the SAS technique.

FIG. 1c is a simplified flow chart depicting the major steps used in processing typical FLASH cell 10. First, the DDI is performed at step 30. After the DDI step 30, the junction implant is performed via step 32. After both the DDI and junction implant have been performed, the SAS technique is performed in step 34.

Figure 2A:
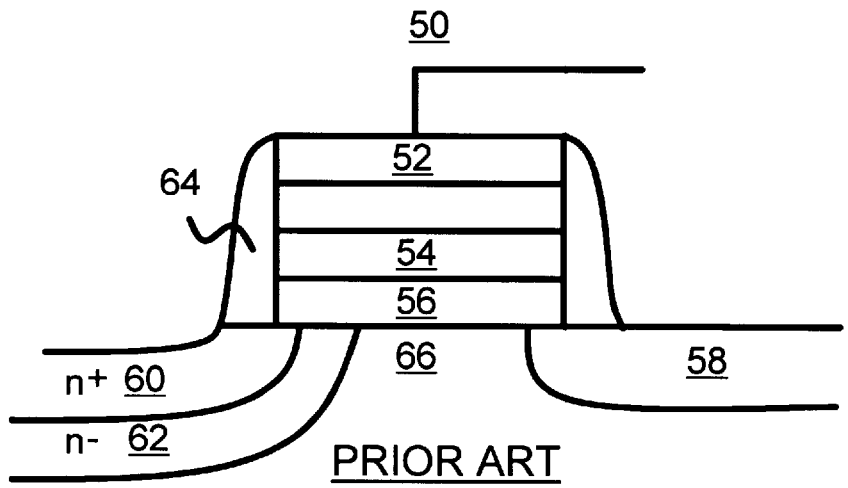
FIG. 2a is a diagram of a FLASH cell in which the stacked gate edge is protected from a self aligned source etch.

FIG. 2a displays a FLASH cell 50 made in accordance with the technique disclosed in U.S. Pat. No. 5,470,773. This technique minimizes the damage to FLASH cell 50 during the SAS technique. FLASH cell 50 is comprised of control gate 52, floating gate 54, tunneling oxide 56, drain 58, junction implant 60, DDI 62, spacer 64, and channel 66. FLASH cell 50 is shown with SAS mask 68. Because of DDI 62, the junction is graded. In addition, FLASH cell 50 has not suffered damage induced by the SAS technique used during processing.

Figure 2B:
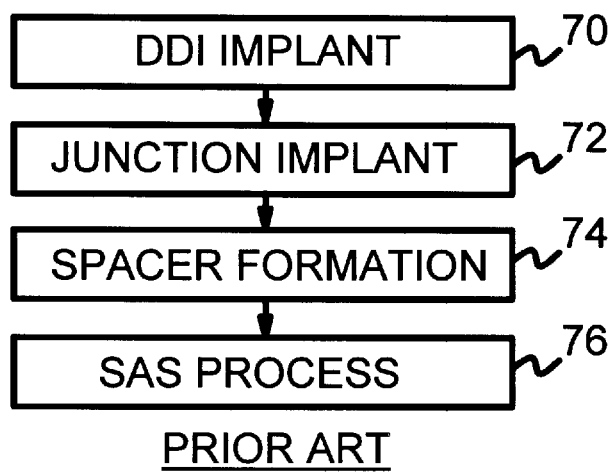
FIG. 2b is a simplified flow chart of a process used to produce a FLASH cell in which the stacked gate edge is protected from a self aligned source etch.

FIG. 2b shows a simplified flow chart of the process used to form FLASH cell 50. First, DDI implant step 70 is performed. The junction implant is then performed through step 72. Next, the spacer is provided at step 74. Finally, the SAS process is employed in step 70. Because the spacer providing step 74 is formed prior to the SAS implant step 76, the process of FIG. 2b results in FLASH cell 50 not having damage in tunneling oxide 56 and junction 60.

Although the FLASH cells shown in FIGS. 1b and 2a perform their desired functions, those with ordinary skill in the art will realize that these cells will not function at very short channel lengths or high densities of FLASH cells. Referring back to FIG. 1a, although junction 46 is abrupt, channel 49 has not been shortened. Referring now to FIG. 1b, although DDI 20 results in a graded junction, DDI 20 has also reduced the effective length of channel 24. Similarly, channel 66 shown in FIG. 2a has also been shortened due to DDI 62. Thus, although the SAS techniques used to make FLASH cells 10 and 50 allow for higher density, as the FLASH cells become smaller, the cells can no longer function. In addition, because the DDI dopant is implanted prior to the junction implant and typically diffuses more rapidly than the junction implant, the diffusion of the DDI dopant constrains the thermal cycling of the junction. Finally, it would be desirable if these problems in processing and a FLASH cell could be remedied without significantly complicating processing of the FLASH cell.

The present method and system is for a memory cell having a graded junction. The method and system will be described with reference to a FLASH cell processed using an SAS technique. In addition, the method and system will be described using an arsenic ("As") junction implant and a phosphorus ("P") DDI. However, one of ordinary skill in the art will understand that the method and system are not limited to this type of cell, these processing techniques, or these dopants.

Figure 3:
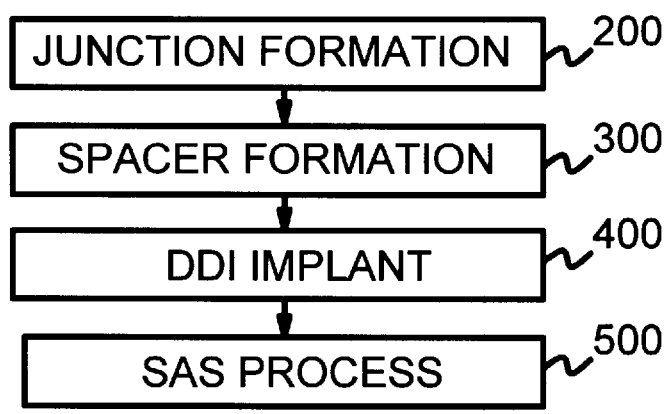
FIG. 3 is a simple flow chart of the process for providing a storage element in accordance with the method and system.

The present method and apparatus provide the benefits of conventional DDI, without the large reduction in effective channel length. FIG. 3 is a simplified flow chart of one embodiment of the method. First, the As junction of the cell is formed in step 200. After the As junction is formed, a spacer is to the cell introduced using step 300. Before or after the spacer formation is completed, the DDI in the cell is carried out in step 400. Finally, the SAS process of the cell is employed at step 500. In the method, the order of implantation of the junction and DDI dopants are reversed as compared to the conventional methods of FIGS. 1c and 2b.

Figure 4:
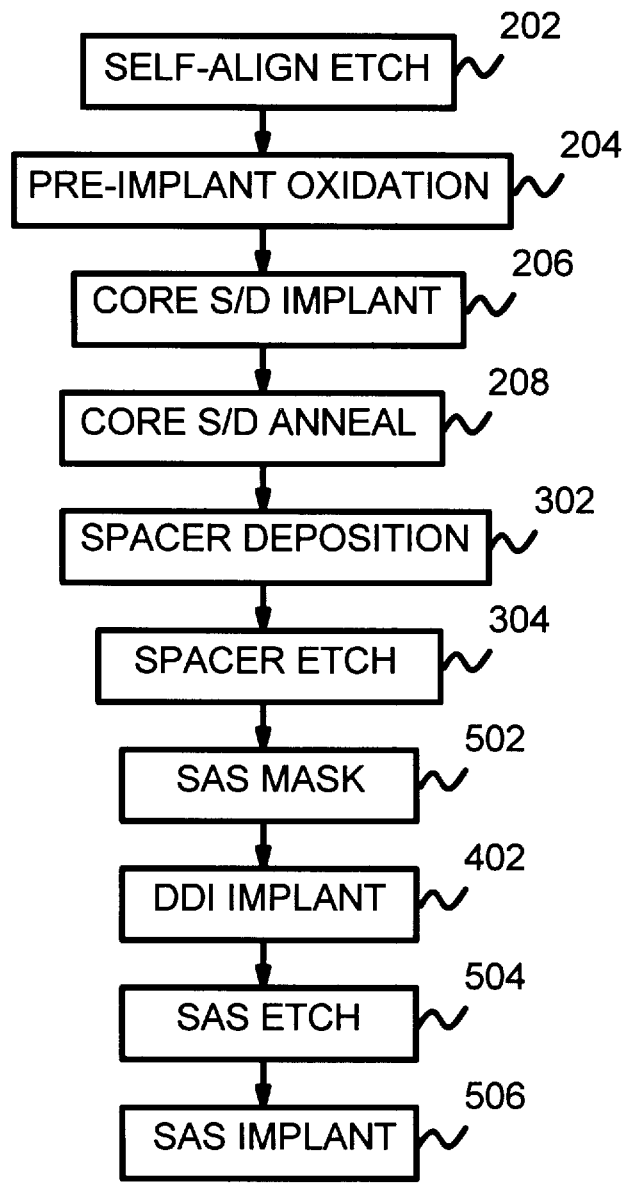
FIG. 4 is a detailed flow chart of the process for providing the storage element in accordance with the method and system.

FIG. 4 shows a more detailed flow chart of one embodiment of the process in accordance with the method and system. Referring back to FIG. 3, memory cell junction formation 200 is carried out through steps 202–208 of the flow chart in FIG. 4. First, the self aligned etch for forming the memory cell junction which includes a core source/drain implant is carried out at step 202. The pre-implant oxidation step is shown in step 204. Next, the core source/drain ("core S/D") implant including a source implant proximate to the channel is carried out in step 206. In the preferred embodiment, the core S/D implant is As. The core S/D anneal is performed in step 208. Thus, the As junction implant and thermal cycling are performed in steps 202–208, prior to the DDI.

The spacer is provided in steps 302–304 of FIG. 4. First, the spacer is deposited proximate to the memory cell junction via step 302. In one embodiment of the invention, a spacer etch is performed in step 304. This step is optional. In addition, the spacer etch step 304 could be performed after the DDI implant step 402, discussed below. In an embodiment where the spacer etch step 304 occurs after the DDI implant step 402, the DDI implant proximate to the source implant and the channel step 402 is carried out before spacer formation is completed.

The SAS mask is applied in step 502. The DDI implant proximate to the source implant and the channel is then performed in step 402. In the preferred embodiment, the DDI implant is phosphorus. Next, the SAS process is continued in the SAS etch step 504 and the SAS implantation thereby forming the source implant step 506. Note that some conventional steps may have been omitted.

Because the DDI implant, step 402 in FIG. 4, is performed after the junction implant and anneal, steps 202–208 in FIG. 4, the diffusion of the phosphorus is not a consideration in the junction (As) anneal. Since the SAS process is carried out after the spacer has been provided, the stacked gate edge is protected and the SAS process for forming the source implant does not induce the damage of conventional SAS processing. Finally, additional steps have not been introduced in processing. Thus, processing is easier.

Figure 5A:
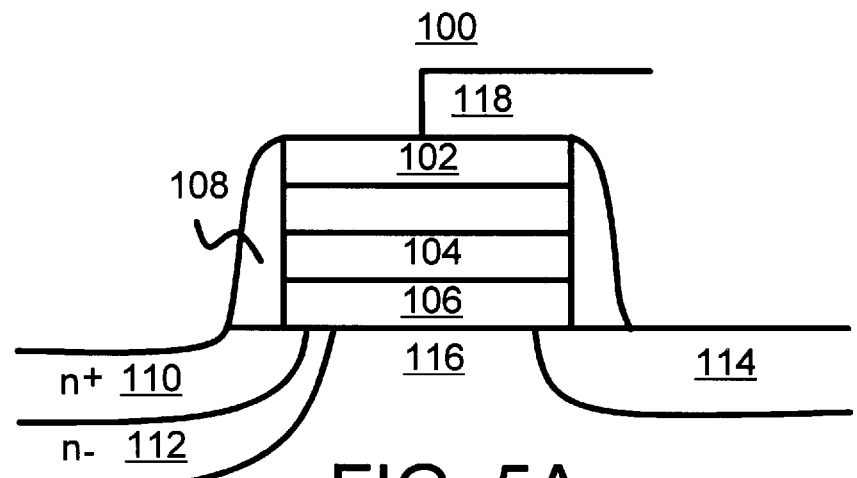
FIG. 5a is a diagram of a FLASH cell in accordance with one embodiment of the method and system.
Figure 5B:
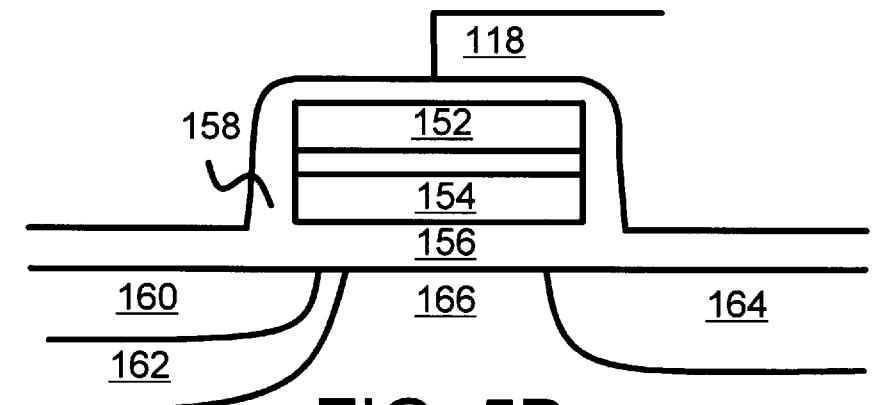
FIG. 5b is a diagram of a FLASH cell in accordance with a second embodiment of the method and system.

To more particularly illustrate the method and system, refer now to FIGS. 5a and 5b. FIG. 5a shows a FLASH cell 100 made in accordance with one embodiment of the method and system. FLASH cell 100 is comprised of control gate 102, floating gate 104, tunneling oxide 106, spacer 108, junction implant 110, DDI 112, drain 114, and channel 116. FLASH cell 100 is shown with SAS mask 118. In the preferred embodiment, the dopants used for junction implant 110 and DDI 112 are As and P, respectively. Because spacer 108 is provided before DDI 112, DDI 112 is offset from gate 104 by spacer 108 during implantation. The phosphorus used as a dopant for DDI 112 does not diffuse as far under gate 104 during subsequent thermal cycling. Thus, even after diffusion, DDI 112 is offset from gate 104. Unlike conventional DDI storage elements, the effective length of channel 116 in the cell has not been substantially reduced. Thus, a very small FLASH cell 100 having a graded junction can be provided. In addition, because the As junction implant and anneal are performed prior to the DDI implant, an optimal As junction can be formed without constraints due to phosphorus diffusion.

Figure 5C:
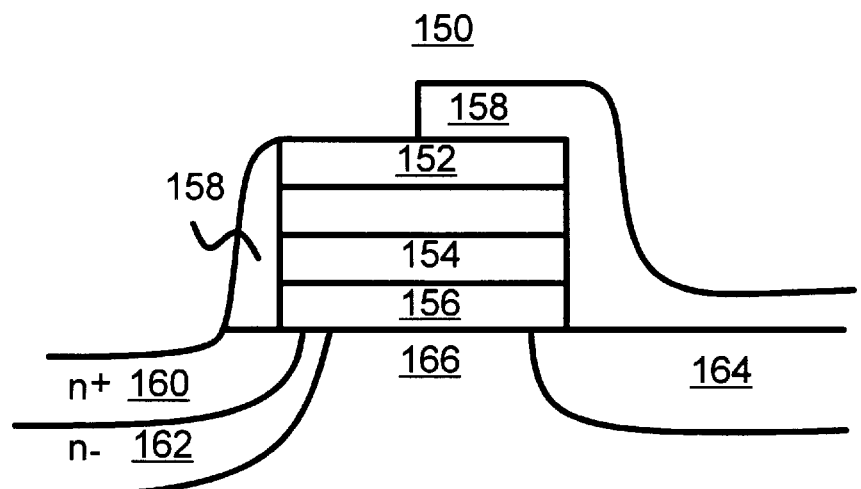
FIG. 5c is a diagram of a FLASH cell in accordance with a second embodiment of the method and system after the SAS etch has been completed and the SAS mask has been removed.

Another embodiment of a FLASH cell 150 in accordance with the method and system is shown in FIG. 5b. FLASH cell 150 is formed when spacer etch step 304 of FIG. 4 is omitted. FLASH cell 150 is comprised of control gate 152, floating gate 154, spacer 158, junction implant 160, DDI 162, drain 164, and channel 166. The junction 160 is proximate the channel 166, and the DDI 162 is proximate to the junction 160 and the channel 166. FLASH CELL 150 is shown with SAS mask 118. FIG. 5c shows one embodiment of FLASH cell 150 after the SAS etch has been completed and SAS mask 118 has been removed.

In the preferred embodiment, the dopants used for junction implant 160 and DDI 162 are As and P, respectively. Referring now to FIG. 5b, because spacer 158 is provided before DDI 162, DDI 162 is offset from gate 154 by spacer 158 during implantation. The phosphorus used as a dopant for DDI 162 does not diffuse as far under gate 104 during subsequent thermal cycling of the junction. Thus, even after diffusion, DDI 162 is offset from gate 154. Unlike conventional DDI storage elements, the effective length of channel 166 of the cell has not been substantially reduced. Consequently, a very small FLASH cell having a graded junction can be provided. As with FLASH cell 100, the processing of As junction 160 is decoupled from that of DDI 162.

FIG. 5c depicts one embodiment of FLASH cell 150 after the SAS etch has been completed and the SAS mask 118 has been removed. Note that spacer 158 is now comprised of two portions. One portion comprises a spacer on same side of the gate 154 as the As junction 160. The other portion of spacer 158 is on the same side of the gate 154 as the drain 164.

A method and system has been disclosed for a memory cell having a DDI junction. A preferred embodiment of the method and system performs the DDI after the junction implant, junction anneal, and spacer formation have been completed. Thus, the junction implant and thermal cycling are decoupled from that of the DDI. Because the spacer is formed prior to the DDI, the DDI is offset from the gate. Consequently, the effective channel length is not reduced. The method and system thus provide a graded junction in a very small memory cell, such as a FLASH cell.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a memory cell having a channel comprising the sequential steps of:
   (a) providing a junction implant to the memory cell proximate to the channel;
   (b) providing a spacer to the memory cell proximate to the junction implant; and
   (c) providing a double diffuse implant to the memory cell proximate to the junction implant and the channel, wherein an effective channel length is not substantially reduced.

2. The method of claim 1 wherein the junction implant providing step (a) further comprises the steps of:
   (a1) providing a junction implant; and
   (a2) providing an anneal of the junction implant.

3. The method of claim 2 wherein the spacer providing step (b) further comprises:
   (b1) depositing a spacer proximate to the junction implant; and
   (b2) providing an etch of the spacer.

4. The method of claim 3 wherein the memory cell is a FLASH cell and the method further comprises the step of:
   (d) providing a self aligned source process to the memory cell for forming the junction implant.

5. The method of claim 3 wherein the junction implant providing step (a) further comprises the step of
   (a1) providing arsenic for the junction implant.

6. The method of claim 5 wherein the double diffuse implant providing step (c) further comprises the step of
   (c1) providing phosphorus for the double diffuse implant.

7. The method of claim 2 further comprising the step of (d) providing an etch of the spacer.

8. The method of claim 7 wherein the memory cell is a FLASH cell and the method further comprises the step of:
   (e) providing a self aligned source process to the memory cell for forming the junction implant.

9. The method of claim 7 wherein the junction implant providing step (a) further comprises the step of
   (a1) providing arsenic for the junction implant.

10. The method of claim 9 wherein the double diffuse implant providing step (c) further comprises the step of
    (c1) providing phosphorus for the double diffuse implant.

11. The method of claim 2 wherein the junction implant providing step (a) further comprises the step of
    (a1) providing arsenic for the junction implant.

12. The method of claim 11 wherein the double diffuse implant providing step (c) further comprises the step of
    (c1) providing phosphorus for the double diffuse implant.

13. The method of claim 1 wherein the spacer providing step (b) further comprises:
    (b1) depositing a spacer proximate to the junction implant; and
    (b2) providing an etch of the spacer.

14. The method of claim 13 wherein the junction implant providing step (a) further comprises the step of
    (a1) providing arsenic for the junction implant.

15. The method of claim 14 wherein the double diffuse implant providing step (c) further comprises the step of
    (c1) providing phosphorus for the double diffuse implant.

16. The method of claim 1 further comprising the step of (d) providing an etch of the spacer.

17. The method of claim 16 wherein the junction implant providing step (a) further comprises the step of
  (a11) providing arsenic for the junction implant.

18. The method of claim 17 wherein the double diffuse implant providing step (c) further comprises the step of
  (c1) providing phosphorus for the double diffuse implant.

19. The method of claim 1 wherein the memory cell is a FLASH cell and the method further comprises the step of:
  (d) providing a self aligned source process to the memory cell for forming the junction implant.

20. The method of claim 1 wherein the junction implant providing step (a) further comprises the step of
  (a1) providing arsenic for the junction implant.

21. The method of claim 20 wherein the double diffuse implant providing step (c) further comprises the step of
  (c1) providing phosphorus for the double diffuse implant.

22. A method for providing a FLASH cell comprising the sequential steps of:
  (a) providing a self aligned etch to the FLASH cell for forming therein a core source/drain implant, including a source implant, proximate to a channel;
  (b) providing a pre-implant oxidation of the FLASH cell;
  (c) providing a core source/drain mask and a core source/drain implant to the FLASH cell;
  (d) providing a spacer to the FLASH cell proximate to the core source/drain implant;
  (e) providing a self aligned source mask to the FLASH cell proximate to the source implant;
  (f) providing a double diffuse implant to the FLASH cell proximate to the source implant and the channel. wherein an effective channel length is not substantially reduced;
  (g) providing a self aligned source etch to the FLASH cell for forming the source implant; and
  (h) providing a self aligned source implant to the FLASH cell for forming the source implant.

23. The method of claim 22 wherein spacer providing step (d) further comprises the sequential steps of:
  (d1) depositing a spacer; and
  (d2) providing an etch of the spacer.

24. The method of claim 23 wherein the core source/drain implant of step (c) is arsenic; and the double diffuse implant of step (f) is phosphorus.

25. The method of claim 22 wherein the core source/drain implant of step (c) is arsenic; and the double diffuse implant of step (f) is phosphorus.

26. A method for providing a FLASH cell comprising the sequential steps of:
  (a) providing a self aligned etch to the FLASH cell for forming therein a core source/drain implant, including a source implant, proximate to a channel;
  (b) providing a pre-implant oxidation to the FLASH cell;
  (c) providing a core source/drain mask and the core source/drain implant to the FLASH cell;
  (d) depositing a spacer in the FLASH cell proximate to the core source/drain implant;
  (e) providing a self aligned source mask to the FLASH cell proximate to the source implant;
  (f) providing a double diffuse implant to the FLASH cell proximate to the source implant and the channel, wherein the effective channel length is not substantially reduced;
  (g) providing a spacer etch for etching the spacer;
  (g) providing a self aligned source etch to the FLASH cell for forming the source implant; and
  (h) providing a self aligned source implant to the FLASH cell for forming the source implant.

27. The method of claim 26 wherein the core source/drain implant of step (c) is arsenic; and the double diffuse implant of step (f) is phosphorus.

* * * * *